United States Patent
Staals et al.

(10) Patent No.: US 12,287,582 B2
(45) Date of Patent: Apr. 29, 2025

(54) METHOD FOR CONTROLLING A LITHOGRAPHIC APPARATUS AND ASSOCIATED APPARATUSES

(71) Applicant: ASML NETHERLANDS B.V., Veldhoven (NL)

(72) Inventors: Frank Staals, Eindhoven (NL); Simon Hendrik Celine Van Gorp, Oud-Turnhout (BE)

(73) Assignee: ASML NETHERLANDS B.V., Veldhoven (NL)

( * ) Notice: Subject to any disclaimer, the term of this patent is extended or adjusted under 35 U.S.C. 154(b) by 659 days.

(21) Appl. No.: 17/437,884

(22) PCT Filed: Feb. 17, 2020

(86) PCT No.: PCT/EP2020/054073
§ 371 (c)(1),
(2) Date: Sep. 10, 2021

(87) PCT Pub. No.: WO2020/193010
PCT Pub. Date: Oct. 1, 2020

(65) Prior Publication Data
US 2022/0146946 A1    May 12, 2022

(30) Foreign Application Priority Data

Mar. 22, 2019 (EP) .................................... 19164702
Jul. 11, 2019 (EP) .................................... 19185785

(51) Int. Cl.
*G03F 7/00* (2006.01)
(52) U.S. Cl.
CPC ...... *G03F 7/70525* (2013.01); *G03F 7/70625* (2013.01); *G03F 7/70633* (2013.01); *G03F 7/70641* (2013.01); *G03F 7/70725* (2013.01)

(58) Field of Classification Search
CPC ............. G03F 7/70525; G03F 7/70625; G03F 7/70633; G03F 7/70641; G03F 7/70725; G03F 7/70483
See application file for complete search history.

(56) References Cited

U.S. PATENT DOCUMENTS 5,067,067 A  * 11/1991 Estelle ............... G05B 19/4097
                                                        700/36
9,310,316 B2 *  4/2016 Wu ..................... G01N 21/9501
(Continued)

FOREIGN PATENT DOCUMENTS

EP          3291007         3/2018
WO        2009078708        6/2009
(Continued)

OTHER PUBLICATIONS

International Search Report and Written Opinion issued in corresponding PCT Patent Application No. PCT/EP2020/054073, dated May 12, 2020.
(Continued)

*Primary Examiner* — Thomas C Lee
*Assistant Examiner* — Tyler Dean Hedrick
(74) *Attorney, Agent, or Firm* — Pillsbury Winthrop Shaw Pittman, LLP

(57) ABSTRACT

A method for configuring an apparatus for providing structures to a layer on a substrate, the method including: obtaining first data including substrate specific data as measured and/or modeled before the providing of the structures to the layer on the substrate; and determining a configuration of the apparatus for at least two different control regimes based on the first data and the use of a common merit function including parameters associated with the at least two control regimes.

20 Claims, 5 Drawing Sheets

(56) References Cited

U.S. PATENT DOCUMENTS

| | | | |
|---|---|---|---|
| 2006/0033921 A1 | 2/2006 | Den Boef et al. | |
| 2006/0066855 A1 | 3/2006 | Boef et al. | |
| 2008/0294280 A1 | 11/2008 | Okita | |
| 2010/0104068 A1* | 4/2010 | Kilby | A61N 5/1031 378/65 |
| 2010/0201963 A1 | 8/2010 | Cramer et al. | |
| 2011/0027704 A1 | 2/2011 | Cramer et al. | |
| 2011/0043791 A1 | 2/2011 | Smilde et al. | |
| 2011/0102753 A1 | 5/2011 | Van De Kerkhof et al. | |
| 2012/0009511 A1* | 1/2012 | Dmitriev | G03F 1/84 430/5 |
| 2012/0044470 A1 | 2/2012 | Smilde et al. | |
| 2012/0123581 A1 | 5/2012 | Smilde et al. | |
| 2013/0258310 A1 | 10/2013 | Smilde et al. | |
| 2013/0271740 A1 | 10/2013 | Quintanilha | |
| 2017/0220928 A1* | 8/2017 | Hajizadeh | G06Q 10/0637 |
| 2018/0299795 A1* | 10/2018 | Tyminski | G06T 7/73 |
| 2021/0048801 A1* | 2/2021 | Windmeier | G05B 19/41885 |

FOREIGN PATENT DOCUMENTS

| | | |
|---|---|---|
| WO | 2009106279 | 9/2009 |
| WO | 2009148976 | 12/2009 |
| WO | 2013178422 | 12/2013 |
| WO | 2016142169 | 9/2016 |
| WO | 2016202559 | 12/2016 |
| WO | 2019110261 | 6/2019 |

OTHER PUBLICATIONS

Office Action issued in corresponding Chinese Patent Application No. 202080022847.3, dated Nov. 16, 2023.

* cited by examiner (a)

(b)

METHOD FOR CONTROLLING A LITHOGRAPHIC APPARATUS AND ASSOCIATED APPARATUSES

CROSS-REFERENCE TO RELATION APPLICATIONS

This application is the U.S. national phase entry of PCT Patent Application No. PCT/EP2020/054073 which was filed on Feb. 17, 2020, which claims the benefit of priority of European Patent Application No. 19164702.3 which was filed on Mar. 22, 2019 and of European Patent Application No. 19185785.3 which was filed on Jul. 11, 2019, each of which is incorporated herein in its entirety by reference.

BACKGROUND

Field of the Invention

The present invention relates to methods and apparatus for applying patterns to a substrate in a lithographic process.

Background

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to monitor the lithographic process, parameters of the patterned substrate are measured. Parameters may include, for example, the overlay error between successive layers formed in or on the patterned substrate and critical linewidth (CD) of developed photosensitive resist. This measurement may be performed on a product substrate and/or on a dedicated metrology target. There are various techniques for making measurements of the microscopic structures formed in lithographic processes, including the use of scanning electron microscopes and various specialized tools. A fast and non-invasive form of specialized inspection tool is a scatterometer in which a beam of radiation is directed onto a target on the surface of the substrate and properties of the scattered or reflected beam are measured. Two main types of scatterometer are known. Spectroscopic scatterometers direct a broadband radiation beam onto the substrate and measure the spectrum (intensity as a function of wavelength) of the radiation scattered into a particular narrow angular range. Angularly resolved scatterometers use a monochromatic radiation beam and measure the intensity of the scattered radiation as a function of angle.

Examples of known scatterometers include angle-resolved scatterometers of the type described in US2006033921A1 and US2010201963A1. The targets used by such scatterometers are relatively large, e.g., 40 µm by 40 µm, gratings and the measurement beam generates a spot that is smaller than the grating (i.e., the grating is underfilled). In addition to measurement of feature shapes by reconstruction, diffraction based overlay can be measured using such apparatus, as described in published patent application US2006066855A1. Diffraction-based overlay metrology using dark-field imaging of the diffraction orders enables overlay measurements on smaller targets. Examples of dark field imaging metrology can be found in international patent applications WO 2009/078708 and WO 2009/106279 which documents are hereby incorporated by reference in their entirety. Further developments of the technique have been described in published patent publications US20110027704A, US20110043791A, US2011102753A1, US20120044470A, US20120123581A, US20130258310A, US20130271740A and WO2013178422A1. These targets can be smaller than the illumination spot and may be surrounded by product structures on a wafer. Multiple gratings can be measured in one image, using a composite grating target. The contents of all these applications are also incorporated herein by reference.

In performing lithographic processes, such as application of a pattern on a substrate or measurement of such a pattern, process control methods are used to monitor and control the process. Such process control techniques are typically performed to obtain corrections for control of the lithographic process. It would be desirable to improve such process control methods.

SUMMARY OF THE INVENTION

In a first aspect of the invention, there is provided method for configuring an apparatus for providing structures to a layer on a substrate, the method comprising: obtaining first data comprising substrate specific data as measured and/or modeled before the providing of the structures to the layer on the substrate; and determining a configuration of the apparatus for at least two different control regimes based on said first data and the use of a common merit function comprising parameters associated with the at least two control regimes.

In other aspects of the invention, there is provided a computer program comprising program instructions operable to perform the method of the first aspect when run on a suitable apparatus, a processing device comprising a processor and storage with such a computer program and an apparatus with such a processing device.

Further aspects, features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example, with reference to the accompanying drawings in which.

DETAILED DESCRIPTION

Before describing embodiments of the invention in detail, it is instructive to present an example environment in which embodiments of the present invention may be implemented.

Figure 1:
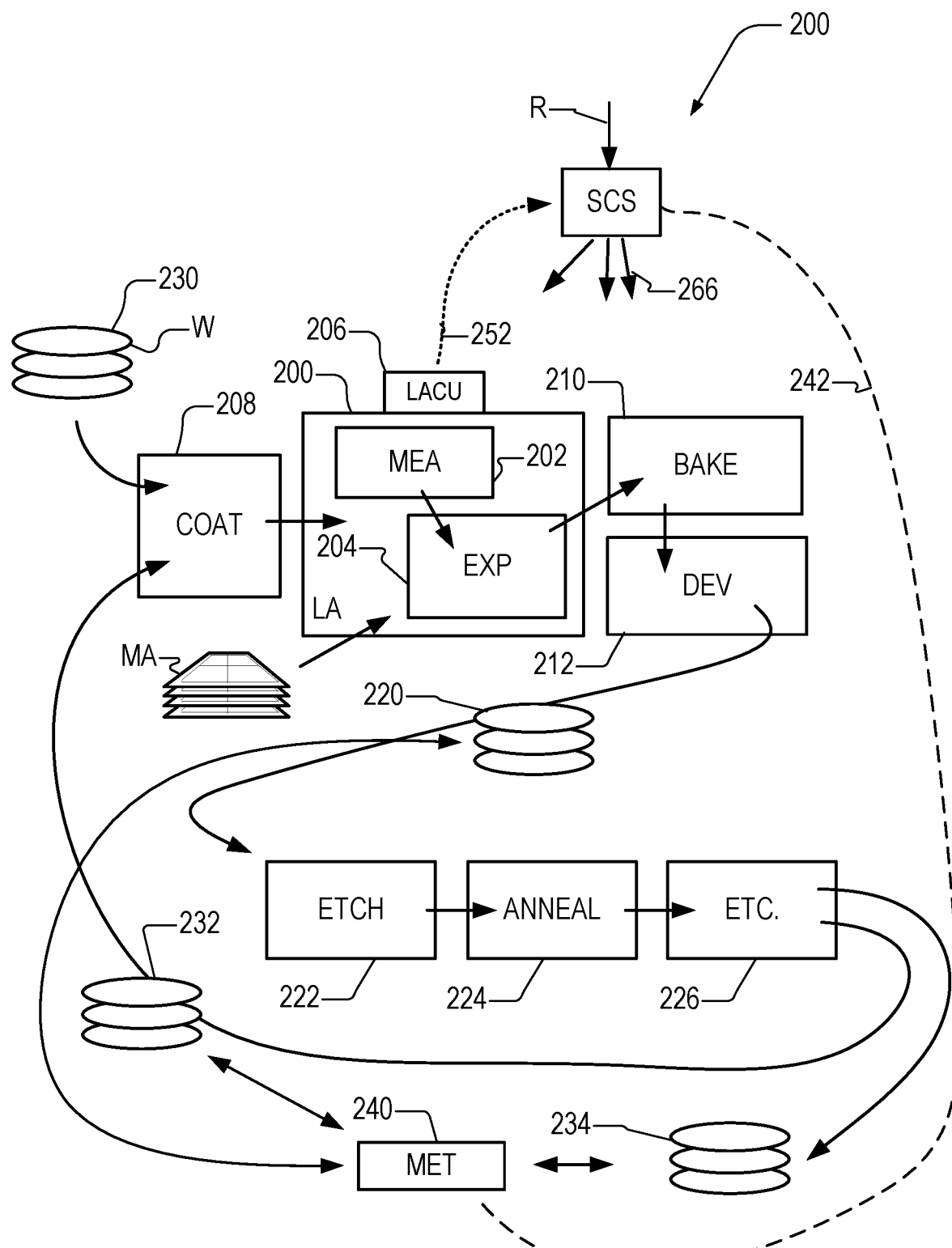
FIG. 1 depicts a lithographic apparatus together with other apparatuses forming a production facility for semiconductor devices.

FIG. 1 at 200 shows a lithographic apparatus LA as part of an industrial production facility implementing a high-volume, lithographic manufacturing process. In the present example, the manufacturing process is adapted for the manufacture of for semiconductor products (integrated circuits) on substrates such as semiconductor wafers. The skilled person will appreciate that a wide variety of products can be manufactured by processing different types of substrates in variants of this process. The production of semiconductor products is used purely as an example which has great commercial significance today.

Within the lithographic apparatus (or "litho tool" 200 for short), a measurement station MEA is shown at 202 and an exposure station EXP is shown at 204. A control unit LACU is shown at 206. In this example, each substrate visits the measurement station and the exposure station to have a pattern applied. In an optical lithographic apparatus, for example, a projection system is used to transfer a product pattern from a patterning device MA onto the substrate using conditioned radiation and a projection system. This is done by forming an image of the pattern in a layer of radiation-sensitive resist material.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. The patterning MA device may be a mask or reticle, which imparts a pattern to a radiation beam transmitted or reflected by the patterning device. Well-known modes of operation include a stepping mode and a scanning mode. As is well known, the projection system may cooperate with support and positioning systems for the substrate and the patterning device in a variety of ways to apply a desired pattern to many target portions across a substrate. Programmable patterning devices may be used instead of reticles having a fixed pattern. The radiation for example may include electromagnetic radiation in the deep ultraviolet (DUV) or extreme ultraviolet (EUV) wavebands. The present disclosure is also applicable to other types of lithographic process, for example imprint lithography and direct writing lithography, for example by electron beam.

The lithographic apparatus control unit LACU which controls all the movements and measurements of various actuators and sensors to receive substrates W and reticles MA and to implement the patterning operations. LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus.

Before the pattern is applied to a substrate at the exposure station EXP, the substrate is processed in at the measurement station MEA so that various preparatory steps may be carried out. The preparatory steps may include mapping the surface height of the substrate using a level sensor and measuring the position of alignment marks on the substrate using an alignment sensor. The alignment marks are arranged nominally in a regular grid pattern. However, due to inaccuracies in creating the marks and also due to deformations of the substrate that occur throughout its processing, the marks deviate from the ideal grid. Consequently, in addition to measuring position and orientation of the substrate, the alignment sensor in practice must measure in detail the positions of many marks across the substrate area, if the apparatus is to print product features at the correct locations with very high accuracy. The apparatus may be of a so-called dual stage type which has two substrate tables, each with a positioning system controlled by the control unit LACU. While one substrate on one substrate table is being exposed at the exposure station EXP, another substrate can be loaded onto the other substrate table at the measurement station MEA so that various preparatory steps may be carried out. The measurement of alignment marks is therefore very time-consuming and the provision of two substrate tables enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations. Lithographic apparatus LA may for example is of a so-called dual stage type which has two substrate tables and two stations—an exposure station and a measurement station—between which the substrate tables can be exchanged.

Within the production facility, apparatus 200 forms part of a "litho cell" or "litho cluster" that contains also a coating apparatus 208 for applying photosensitive resist and other coatings to substrates W for patterning by the apparatus 200. At an output side of apparatus 200, a baking apparatus 210 and developing apparatus 212 are provided for developing the exposed pattern into a physical resist pattern. Between all of these apparatuses, substrate handling systems take care of supporting the substrates and transferring them from one piece of apparatus to the next. These apparatuses, which are often collectively referred to as the track, are under the control of a track control unit which is itself controlled by a supervisory control system SCS, which also controls the lithographic apparatus via lithographic apparatus control unit LACU. Thus, the different apparatus can be operated to maximize throughput and processing efficiency. Supervisory control system SCS receives recipe information R which provides in great detail a definition of the steps to be performed to create each patterned substrate.

Once the pattern has been applied and developed in the litho cell, patterned substrates 220 are transferred to other processing apparatuses such as are illustrated at 222, 224, 226. A wide range of processing steps is implemented by various apparatuses in a typical manufacturing facility. For the sake of example, apparatus 222 in this embodiment is an etching station, and apparatus 224 performs a post-etch annealing step. Further physical and/or chemical processing steps are applied in further apparatuses, 226, etc. Numerous types of operation can be required to make a real device, such as deposition of material, modification of surface material characteristics (oxidation, doping, ion implantation etc.), chemical-mechanical polishing (CMP), and so forth. The apparatus 226 may, in practice, represent a series of different processing steps performed in one or more apparatuses. As another example, apparatus and processing steps may be provided for the implementation of self-aligned multiple patterning, to produce multiple smaller features based on a precursor pattern laid down by the lithographic apparatus.

As is well known, the manufacture of semiconductor devices involves many repetitions of such processing, to build up device structures with appropriate materials and patterns, layer-by-layer on the substrate. Accordingly, substrates 230 arriving at the litho cluster may be newly prepared substrates, or they may be substrates that have been processed previously in this cluster or in another apparatus entirely. Similarly, depending on the required processing, substrates 232 on leaving apparatus 226 may be returned for a subsequent patterning operation in the same litho cluster, they may be destined for patterning operations in a different cluster, or they may be finished products to be sent for dicing and packaging.

Each layer of the product structure requires a different set of process steps, and the apparatuses 226 used at each layer may be completely different in type. Further, even where the processing steps to be applied by the apparatus 226 are nominally the same, in a large facility, there may be several supposedly identical machines working in parallel to perform the step 226 on different substrates. Small differences in set-up or faults between these machines can mean that they influence different substrates in different ways. Even steps that are relatively common to each layer, such as etching (apparatus 222) may be implemented by several etching apparatuses that are nominally identical but working in parallel to maximize throughput. In practice, moreover, different layers require different etch processes, for example chemical etches, plasma etches, according to the details of the material to be etched, and special requirements such as, for example, anisotropic etching.

The previous and/or subsequent processes may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly a manufacturing facility in which litho cell LC is located also includes metrology system which receives some or all of the substrates W that have been processed in the litho cell. Metrology results are provided directly or indirectly to the supervisory control system SCS. If errors are detected, adjustments may be made to exposures of subsequent substrates, especially if the metrology can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

Also shown in FIG. 1 is a metrology apparatus 240 which is provided for making measurements of parameters of the products at desired stages in the manufacturing process. A common example of a metrology station in a modern lithographic production facility is a scatterometer, for example a dark-field scatterometer, an angle-resolved scatterometer or a spectroscopic scatterometer, and it may be applied to measure properties of the developed substrates at 220 prior to etching in the apparatus 222. Using metrology apparatus 240, it may be determined, for example, that important performance parameters such as overlay or critical dimension (CD) do not meet specified accuracy requirements in the developed resist. Prior to the etching step, the opportunity exists to strip the developed resist and reprocess the substrates 220 through the litho cluster. The metrology results 242 from the apparatus 240 can be used to maintain accurate performance of the patterning operations in the litho cluster, by supervisory control system SCS and/or control unit LACU 206 making small adjustments over time, thereby minimizing the risk of products being made out-of-specification, and requiring re-work.

Additionally, metrology apparatus 240 and/or other metrology apparatuses (not shown) can be applied to measure properties of the processed substrates 232, 234, and incoming substrates 230. The metrology apparatus can be used on the processed substrate to determine important parameters such as overlay or CD.

A metrology apparatus suitable for use in embodiments of the invention is shown in FIG. 2(a). A target T and diffracted rays of measurement radiation used to illuminate the target are illustrated in more detail in FIG. 2(b). The metrology apparatus illustrated is of a type known as a dark field metrology apparatus. The metrology apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, light emitted by source 11 (e.g., a xenon lamp) is directed onto substrate W via a beam splitter 15 by an optical system comprising lenses 12, 14 and objective lens 16. These lenses are arranged in a double sequence of a 4F arrangement. A different lens arrangement can be used, provided that it still provides a substrate image onto a detector, and simultaneously allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The illumination system in the present examples forms an off-axis illumination mode. In the first illumination mode, aperture plate 13N provides off-axis from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark as any unnecessary light outside the desired illumination mode will interfere with the desired measurement signals.

As shown in FIG. 2(b), target T is placed with substrate W normal to the optical axis O of objective lens 16. The substrate W may be supported by a support (not shown). A ray of measurement radiation I impinging on target T from an angle off the axis O gives rise to a zeroth order ray (solid line 0) and two first order rays (dot-chain line +1 and double dot-chain line −1). It should be remembered that with an overfilled small target, these rays are just one of many parallel rays covering the area of the substrate including metrology target T and other features. Since the aperture in plate 13 has a finite width (necessary to admit a useful quantity of light, the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the grating pitches of the targets and the illumination angles can be designed or adjusted so that the first order rays entering the objective lens are closely aligned with the central optical axis. The rays illustrated in FIGS. 2(a) and 2(b) are shown somewhat off axis, purely to enable them to be more easily distinguished in the diagram.

At least the 0 and +1 orders diffracted by the target T on substrate W are collected by objective lens 16 and directed back through beam splitter 15. Returning to FIG. 2(a), both the first and second illumination modes are illustrated, by designating diametrically opposite apertures labeled as north (N) and south (S). When the incident ray I of measurement radiation is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled −1(S)) are the ones which enter the lens 16.

A second beam splitter 17 divides the diffracted beams into two measurement branches. In a first measurement branch, optical system 18 forms a diffraction spectrum (pupil plane image) of the target on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for many measurement purposes such as reconstruction used in methods described herein. The pupil plane image can also be used for focusing the metrology apparatus and/or normalizing intensity measurements of the first order beam.

In the second measurement branch, optical system 20, 22 forms an image of the target T on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image of the target formed on sensor 23 is formed only from the −1 or +1 first order beam. The images captured by sensors 19 and 23 are output to processor PU which processes the image, the function of which will depend on the particular type of measurements being performed. Note that the term 'image' is used here in a broad sense. An image of the grating lines as such will not be formed, if only one of the −1 and +1 orders is present.

Figure 2:
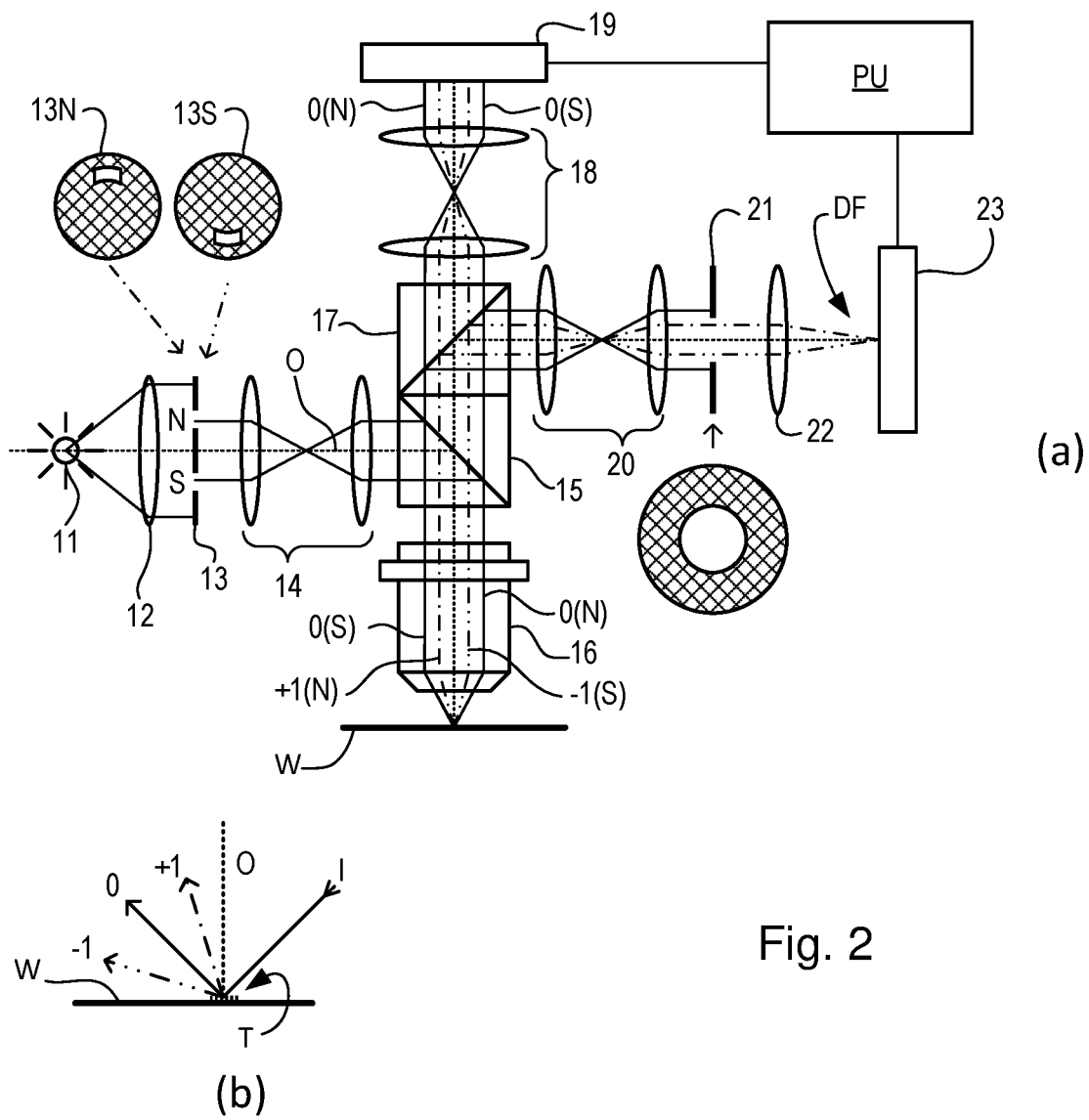
FIG. 2 comprises a schematic diagram of a scatterometer for use in measuring targets according to embodiments of the invention.

The particular forms of aperture plate 13 and field stop 21 shown in FIG. 2 are purely examples. In another embodiment of the invention, on-axis illumination of the targets is used and an aperture stop with an off-axis aperture is used to pass substantially only one first order of diffracted light to the sensor. In yet other embodiments, $2^{nd}$, $3^{rd}$ and higher order beams (not shown in FIG. 2) can be used in measurements, instead of or in addition to the first order beams.

The target T may comprise a number of gratings, which may have differently biased overlay offsets in order to facilitate measurement of overlay between the layers in which the different parts of the composite gratings are formed. The gratings may also differ in their orientation, so as to diffract incoming radiation in X and Y directions. In one example, a target may comprise two X-direction gratings with biased overlay offsets +d and −d, and Y-direction gratings with biased overlay offsets +d and −d. Separate images of these gratings can be identified in the image captured by sensor 23. Once the separate images of the gratings have been identified, the intensities of those individual images can be measured, e.g., by averaging or summing selected pixel intensity values within the identified areas. Intensities and/or other properties of the images can be compared with one another. These results can be combined to measure different parameters of the lithographic process.

Various techniques may be used to improve the accuracy of reproduction of patterns onto a substrate. Accurate reproduction of patterns onto a substrate is not the only concern in the production of ICs. Another concern is the yield, which generally measures how many functional devices a device manufacturer or a device manufacturing process can produce per substrate. Various approaches can be employed to enhance the yield. One such approach attempts to make the production of devices (e.g., imaging a portion of a design layout onto a substrate using a lithographic apparatus such as a scanner) more tolerant to perturbations of at least one of the processing parameters during processing a substrate, e.g., during imaging of a portion of a design layout onto a substrate using a lithographic apparatus. The concept of overlapping process window (OPW) is a useful tool for this approach. The production of devices (e.g., ICs) may include other steps such as substrate measurements before, after or during imaging, loading or unloading of the substrate, loading or unloading of a patterning device, positioning of a die underneath the projection optics before exposure, stepping from one die to another, etc. Further, various patterns on a patterning device may have different process windows (i.e., a space of processing parameters under which a pattern will be produced within specification). Examples of pattern specifications that relate to a potential systematic defect include checks for necking, line pull back, line thinning, CD, edge placement, overlapping, resist top loss, resist undercut and/or bridging. The process window of all or some (usually patterns within a particular area) of the patterns on a patterning device may be obtained by merging (e.g., overlapping) process windows of each individual pattern. The process window of these patterns is thus called an overlapping process window. The boundary of the OPW may contain boundaries of process windows of some of the individual patterns. In another words, these individual patterns limit the OPW. These individual patterns can be referred to as "hot spots" or "process window limiting patterns (PWLPs)," which are used interchangeably herein. When controlling a lithography process, it is possible, and typically economical, to focus on the hot spots. When the hot spots are not defective, it is likely that all the patterns are not defective. The imaging becomes more tolerant to perturbations when values of the processing parameters are closer to the OPW if the values of the processing parameters are outside the OPW, or when the values of the processing parameters are farther away from the boundary of the OPW if the values of the processing parameters are inside the OPW.

Figure 3:
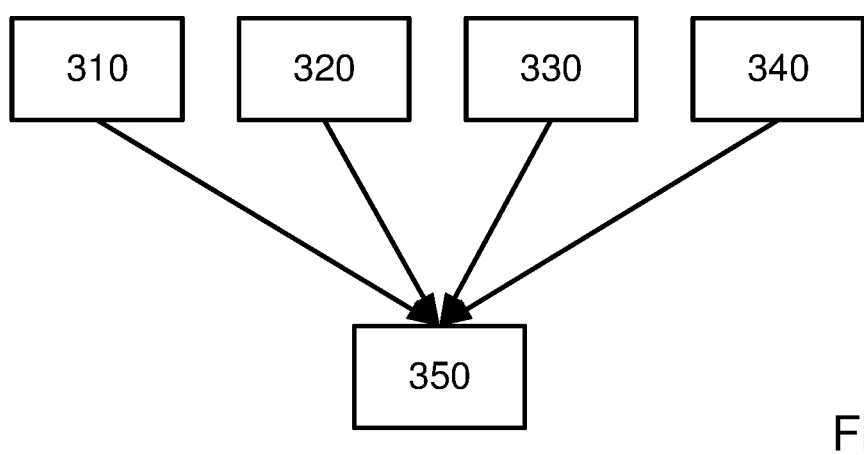
FIG. 3 shows exemplary sources of processing parameters.

FIG. 3 shows exemplary sources of processing parameters 350. One source may be data 310 of the processing apparatus, such as parameters of the source, projection optics, substrate stage, etc. of a lithography apparatus, of a track, etc. Another source may be data 320 from various substrate metrology tools, such as a substrate height map, a focus map, a critical dimension uniformity (CDU) map, etc. Data 320 may be obtained before the applicable substrate was subject to a step (e.g., development) that prevents reworking of the substrate. Another source may be data 330 from one or more patterning device metrology tools, patterning device CDU map, patterning device (e.g., mask) film stack parameter variation, etc. Yet another source may be data 340 from an operator of the processing apparatus.

Figure 4:
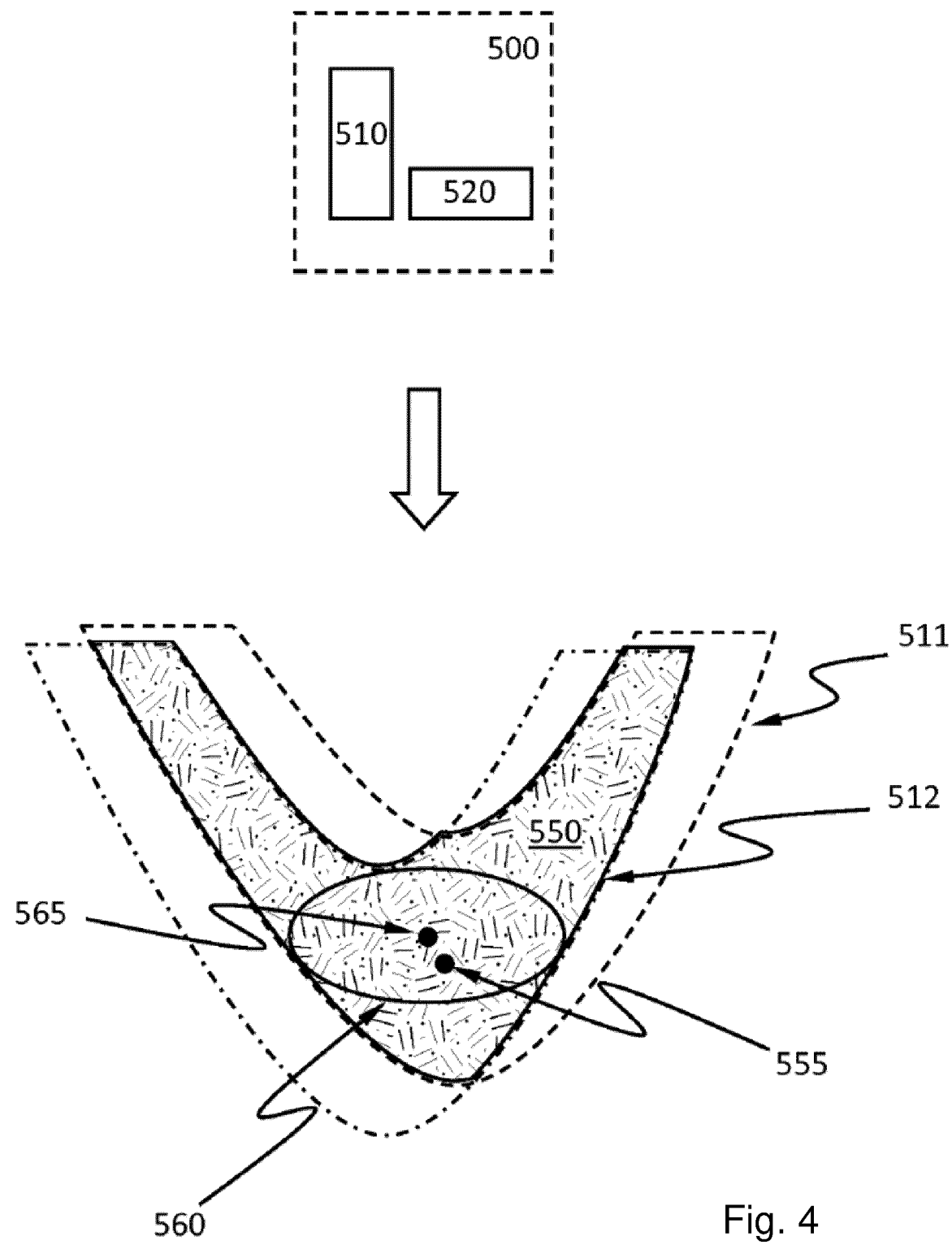
FIG. 4 schematically illustrates a concept of an overlapping process window (OPW)

FIG. 4 schematically illustrates the concept of an OPW. To illustrate the concept, an area, or grid element/pixel, 500 on the patterning device is assumed to have only two individual patterns 510 and 520. The area may include many more patterns. The process windows for the individual patterns 510 and 520 are 511 and 512, respectively. To illustrate the concept, the processing parameters are assumed to only include focus (horizontal axis) and dose (vertical axis). The processing parameters may however include any suitable parameters. The OPW 550 of the area can be obtained by finding the overlap between process windows 511 and 512. The OPW 550 is represented as the hatched area in FIG. 4. The OPW 550 can have an irregular shape. However, in order to easily represent the OPW and to easily determine whether a set of processing parameter values are within the OPW, a "fitted OPW" (e.g., ellipse 560) may be used instead. The "fitted OPW" can be, for example, the largest hyperellipsoid (e.g., ellipse in 2-dimensional processing parameter space as in this example, ellipsoid 3-dimensional processing parameter space, etc.) that fits inside the OPW. Using the "fitted OPW" tends to reduce the computational cost but does not take advantage of the full size of the OPW.

The values of the processing parameters may be selected such that they stay away from the boundary of the OPW or the fitted OPW, in order to decrease the chance that the processing parameters shift outside the OPW and thereby cause defects and decrease the yield. One approach of selecting the values of the processing parameters includes, before actual imaging, (1) optimizing the lithographic apparatus (e.g., optimizing the source and projection optics) and optimizing the design layout, (2) determining the OPW or fitted OPW (e.g., by simulation), and (3) determining a point in the space of the processing parameters (i.e., determining the values of the processing parameters) that is as far away as possible from the boundary of the OPW or fitted OPW (this point may be called the "center" of the OPW or fitted OPW). In the example of FIG. 4, point 555 is the point in the processing parameter space that is as far away as possible from the boundary of the OPW 550 and point 565 is the point in the processing parameter space that is as far away as possible from the boundary of the fitted OPW 560. Point 555 and point 565 may be referred to as the nominal condition. During or before imaging, if the processing parameters shift away from point 555 or point 565, towards the boundary of the OPW or even to the outside the boundary of the OPW, it would be beneficial to have the capability of realizing such a shift and to make appropriate corrections to put the processing parameters back into the OPW and away from its boundary, desirably without interrupting the imaging or other processing.

During or before the actual imaging, the processing parameters may have a perturbation that causes them to deviate from the point that is as far away as possible from the boundary of the OPW or fitted OPW. For example, the focus may change due to topography of a substrate to be exposed, drift in the substrate stage, deformation of the projection optics, etc.; the dose may change to due drift in the source intensity, dwell time, etc. The perturbation may be large enough to cause processing parameters to be outside the OPW, and thus may lead to defects. Various techniques may be used to identify a processing parameter that is perturbed and to correct that processing parameter. For example, if the focus is perturbed, e.g., because an area of the substrate that is slightly raised from the rest of the substrate is being exposed, the substrate stage may be moved or tilted to compensate for the perturbation.

Control of the lithographic process are typically based on measurements fed back or fed forward and then modelled using, for example interfield (across-substrate fingerprint) or intrafield (across-field fingerprint) models. Within a die, there may be separate functional areas such as memory areas, logic areas, contact areas etc. Each different functional area, or different functional area type may have a different process window, each with a different processes window center. For example, different functional area types may have different heights, and therefore different best focus settings. Also, different functional area types may have different structure complexities and therefore different focus tolerances (focus process windows) around each best focus. However, each of these different functional areas will typically be formed using the same focus (or dose or position etc.) setting due to control grid resolution limitations.

The lithographic control is typically performed using offline calculation of one or more set-point corrections for one or more particular control degrees of freedom, based on (for example) measurements of previously formed structures. The set-point corrections may comprise a correction for a particular process parameter, and may comprise the correction of a setting of a particular degree of freedom to compensate for any drift or error such that the measured process parameter remains within specification (e.g., within an allowed variation from a best set-point or best value; for example, an OPW or process window). For example, an important process parameter is focus, and a focus error may manifest itself in a defective structure being formed on a substrate. In a typical focus control loop, a focus feedback methodology may be used. Such a methodology may comprise a metrology step which may measure the focus setting used on a formed structure; e.g., by using diffraction based focus (DBF) techniques in which a target with focus dependent asymmetry is formed such that the focus setting can be subsequently determined by measurement of the asymmetry on the target. The measured focus setting may then be used to determine, offline, a correction for the lithographic process; for example a positional correction for one or both of the reticle stage or substrate stage which corrects the focus offset (defocus). Such an offline positional correction may then be conveyed to the scanner as a set-point best focus correction, for direct actuation by the scanner. The measurements may be obtained over a number of lots, with an average (over the lots) best focus correction applied to each substrate of one or more subsequent lots.

Figure 5:
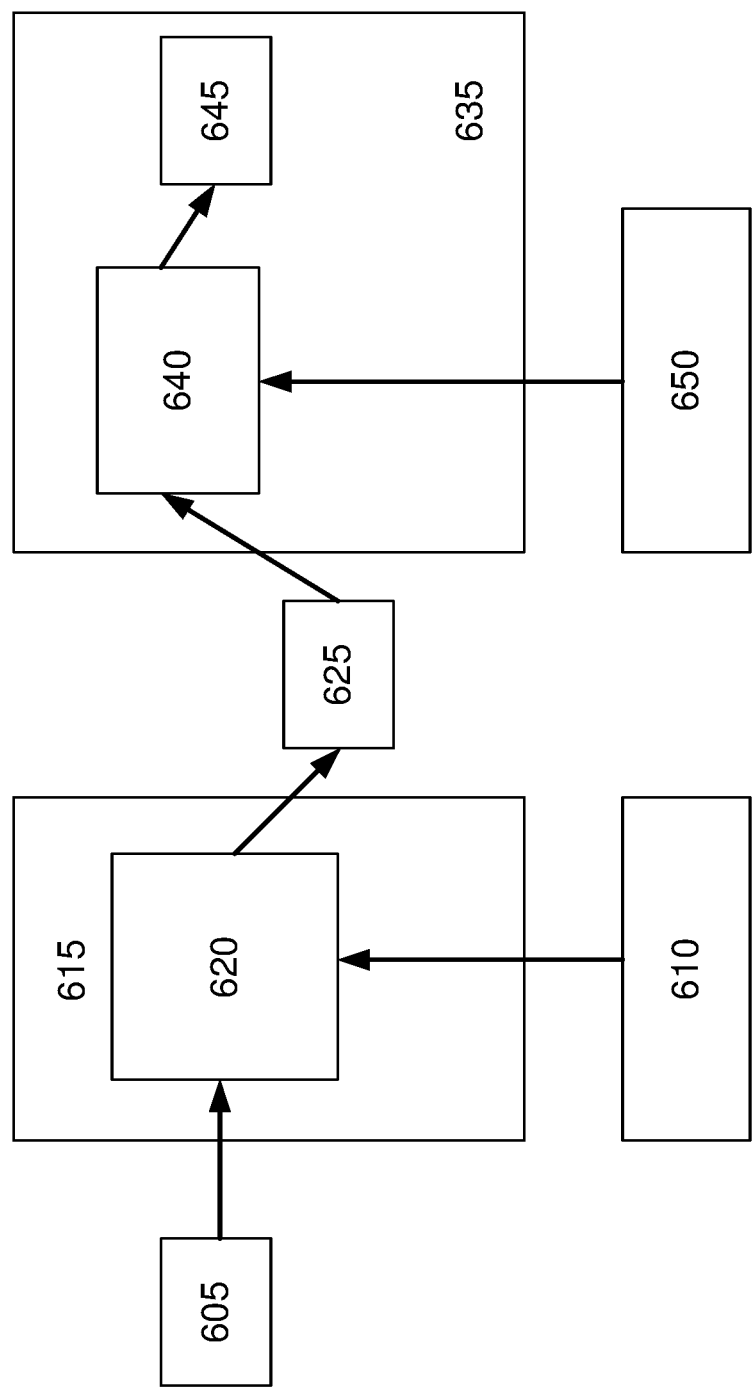
FIG. 5 illustrates schematically a current method of determining corrections for control of a lithographic apparatus.

FIG. 5 illustrates such a methodology. It shows product information 605, such as product layout, illumination mode, product micro-topography etc., and metrology data 610 (e.g., defocus data or overlay data measured from previously produced substrates) being fed to an offline processing device 615 which performs an optimization algorithm 620. The output of the optimization algorithm 620 is one or more set-point corrections/offsets 625, e.g., for actuators which control reticle stage and/or substrate stage positioning (in any direction, i.e., in the x, y and/or z directions, where x and y are the substrate plane direction and z is perpendicular to x and y) within scanner 635; the set-point corrections 625 being calculated to compensate for any offsets/errors (e.g., defocus, dose or overlay offsets/errors) comprised within the metrology data 610. A control algorithm 640 (e.g., leveling algorithm) calculates control set-points 645 using substrate specific metrology data 650. For example, a leveling exposure trajectory (e.g., determining a relative movement or acceleration profile for positioning of the substrate stage relative to the reticle stage during the lithographic process) may be calculated using leveling data (e.g., a wafer height map) and outputs positional set-points 645 for the scanner actuators. The scanner 635 directly applies, equally for each substrate, the set-point corrections 625 to the calculated set-points 645.

The optimization algorithm within the scanner is presently based on a number of different merit functions, one for each control regime. As such, in the example described above, a levelling (or focus) merit function is used for the focus control (scanner z direction control), which is different to an overlay (scanner x/y direction control) merit function, a lens aberration correction merit function etc. As such there are a number of different merit functions performing different optimizations during the same manufacturing process. However, control in this manner limits flexibility in that it does not enable all control factors to be considered, nor all control parameters to be used, for each control regime. This can lead to sub-optimal and even contradictory control strategies for different control regimes of a single process.

Scanner optimization has three largely independent dimensions:
One or more functional (physical) indicators (e.g., functional key performance indicators KPIs);
One or more statistical (die yield) indicators (statistical KPIs); and
Correction potential (ranges and degrees of freedom of scanner (and e.g. etcher) "knobs" or control parameters)

With regard to the functional aspects, these may comprise "per point indicators". An example for leveling or focus optimization in the z-direction (e.g., perpendicular to the substrate plane), may relate to time Moving Average (MA) to time Moving Standard Deviation (MSD), and more specifically a root-mean-square (RMS) optimization of these indicators. The time Moving Average (MA) error and a time Moving Standard Deviation (MSD) of the error of a lithographic stage relates to a critical time window comprising the time interval that each point on a die is exposed (in other words: receives photons). If the average position error for a point on the die during this time interval is high (in other words: high MA-error), the effect is a shift of the exposed image, resulting in focus and/or overlay errors. If the standard deviation of the position error during this time interval is high (in other words: high MSD error), the image may smear, resulting in fading errors. In another example, the KPI typically used for overlay optimization is MA, e.g., typically (in the x and y directions) based on optimizing 1 $MA_X$ and 1 $MA_Y$.

With regard to statistical (e.g., per die) aspect, this is typically a KPI indicative to die yield. Presently, as just mentioned, an RMS optimization is used for levelling. Other statistical measures presently used includes maximization of minimum process window margin per die for process window optimization. Also, there are multiple variations based on these aspects, e g minimize the maximum absolute per point errors, minimize the maximum absolute per-die errors, maximize the minimum local process window margin (per super pixel or per die).

The use of different merit functions for each control regime results in control limitations. For example, a ratio of 1 (equal weighing) is typically imposed between MA and MSD, which is not necessarily optimal. To use a specific illustrative example, the levelling optimization merit function (z-direction exposure trajectory control) presently optimizes $MA_Z^2 + MSD_Z^2$. There are a number of reasons why this is not necessarily optimal. Firstly, there are a number of control aspects may be underestimated in such a merit function. For example, the MSD impact to image contrast (e.g., line width roughness LWR) may be underestimated (or completely neglected), additionally the MSD impact depends on a number of other correlating MSD contributors which may also be underestimated or neglected. Additionally the pre-factor (sensitivity) is at least feature dependent.

Similarly, overlay optimization (x and y-direction exposure trajectory control) typically currently optimizes merit functions based on $MA_X$ and $MA_Y$, which means that the $MSD_X$ and $MSD_Y$ impact is neglected. However, $MSD_X$/$MSD_Y$ affects both CD and CDU, and also imaging contrast (e.g. LWR), both of which have a patterning (or imaging) impact.

It is therefore proposed to use a common merit function in optimization for each control regime. For the merit function to be common for all the relevant control regimes, consideration should be made to the control potential (e.g., actuation potential or available control parameters/knobs), and the KPIs they should optimize for (statistical and functional). The control regimes can include any two or more of: exposure trajectory control (relative stage control between reticle stage and substrate stage) in each of the x, y and z, Rx, Ry, Rz directions, lens aberration correction, dose control, laser bandwidth control (for the source laser), illumination (pupil) control.

It is further proposed that a suitable functional KPI for the merit function is edge placement error (EPE). EPE here is the combined error resultant from global CDU, and local CDU (e.g., LER/LWR) and overlay error. It is these parameters which have the greatest effect on yield, as it is errors in these parameters which effect the relative positioning of features, and whether any two features unintentionally make contact or unintentionally fail to make contact.

In an embodiment, the merit function will comprise a co-optimization of parameters relevant for EPE, and more specifically a co-optimization of parameters relevant for overlay, CD and LWR/LER. Such parameters may comprise, for example some or all of the following parameters $MA_X$, $MA_Y$, $MA_Z$, $MSD_X$, $MSD_Y$, $MSD_Z$, aberration and dose.

The merit function parameters may further comprise lens aberration parameters such as any suitable Zernike process corrections (ZPC) or lithometrics. This may be implemented by having either product specific offsets, or targets within the merit function. These offsets may be implemented for aberration (e.g., ZPCs), or dose, focus etc. Product-specific tuning of parameters or weights in the scanner merit function (they are on a default value otherwise), for aberration is sometimes referred to as lithometrics. A lithometric can be any lithographic performance-parameter of a specific structure in the field that is typically linearly dependent (although may be second order for example) on changes in a reasonable range of Zernike values. This can be described by:

$$LM(\tilde{x}) = \sum_i \frac{\partial LM}{\partial Z_i} Z_i(\tilde{x}) + A(\tilde{x})$$

where $LM(\tilde{x})$ is the value of the lithometric at a specific slit position $\tilde{x}$. The slope of its linear dependence on $Z_i(\tilde{x})$ is given by the lithometric's aberration sensitivity $$\frac{\partial LM}{\partial Z_i}$$

(assumed constant across slit). The constant $A(\tilde{x})$ consists of all other contributors, beside the lens aberrations. Typical lithometrics are CD asymmetry, best focus and pattern location. A weight can be assigned to each lithometric (e.g., between 0 and 5) in an optimization with the other parameters in the merit function. In an embodiment, the lithometrics may comprise wavefront targets, linear and quadratic Zernike sensitivities, linear and quadratic $MSD_X$, $MSD_Y$ $MSD_Z$ and dose sensitivities; where each may be varied per slit position.

More specifically, the merit function may comprise a combination of overlay terms $MA_X$, $MA_Y$, focus term $MA_Z$, dose term D, aberration terms Z, (i.e., different Zernike terms), stage contrast terms $MSD_X$, $MSD_Y$, $MSD_Z$, and CD and LWR terms ($MSD^2_X$, $MSD^2_Y$ $MSD^2_Z$). Consequently a purely exemplary merit function M, which aims to minimize EPE, may take the form:

$$M = a_1 MA_x + a_3 MSD_x + a_4 MSD_x^2 + b_1 MA_y + b_3 MSD_y +$$
$$b_4 MSD_y^2 + c_2 MA_z^2 + c_3 MSD_z + c_4 MSD_z^2 + d_1 D + \Sigma_i e_{1i} Z_i + e_{2i} Z_i^2$$

Additionally, a laser bandwidth or pupil control term could be added.

The proposed merit function, therefore, enables co-optimization of two or more of these terms, so as to co-optimize two or more related performance indicators, such as focus, dose, overlay, CD. LWR and lens aberration control parameters. Such an optimization may take into account all degrees of freedom (actuation and control) of the scanner to optimize for any error based upon all available input data. Such a co-optimization is beneficial compared to individual (e.g., focus, dose, aberration, overlay) optimizations performed presently, because not all errors are independent or individually correctable and different optimizations may require contradictory corrections. For example, optimization of focus across slit is limited as the "slit cannot be bent", i.e., the focus cannot be directly varied non-linearly across the slit by a non-linear variation of distance between reticle and substrate stage. However, in a co-optimization strategy, it may be possible to achieve some of the benefits of direct focus control across the slit by varying dose across the slit and/or via the projection lens optics (e.g., a lens manipulator), for example, so as to optimize EPE (or CD). This is effectively providing an additional control parameter which would not otherwise be available. A particular application for this, for example, is to improve correction at edge dies for edge roll off error (ERO). Co-optimization of focus and dose and therefore using dose control as a control parameter in the optimization, enables better correction for ERO. Other examples may include adding lens (FC) correction potential to leveling optimization or extending from lens correction per field to scanning lens correction.

As stated before, the co-optimization may also include lens control which compensates for lens aberrations. Lens control may be implemented as an optimization sub-recipe associated with a desired balancing of lens aberrations. The optimization sub-recipe recipe may be based on knowledge of critical product structures and their tolerances with respect to individual aberration components (Zernikes). The Scanner can measure a lens aberration profile for every substrate and use this as a further input in a co-optimization which also uses lens control as a further degree of freedom. Scanner optimization of lens control based upon an optimization recipe is described in WO2009/148976 which is herein incorporated by reference in its entirety.

While it is proposed that the same merit function is used for all control regimes, it will be appreciated that not all parameters are relevant to each control regime. As such, for certain control regimes and control actions, one or more parameters irrelevant to that regime may be given zero weighting in the optimization. Of course, not all dependencies and error causes/sources are presently known and are still being discovered. As such, a parameter for which a zero weighting may be presently considered appropriate in a particular control regime might be later found to be relevant (particularly as accuracies and tolerances improve). The present common merit function would make it simple to implement and/or assess a different weighting for this parameter in this control regime if a hitherto unknown dependency was discovered or suspected.

The type of optimization (statistical KPI) can also be improved from those used presently (e.g., RMS). The optimization, for example, may comprise a "dies-in-spec" optimization. This aims to maximize the number of dies within specification, rather than applying an averaged optimization across the substrate (e.g., a least-squares optimization based on a least squares minimization of focus difference from best focus across the substrate). As such, a "dies-in-spec" optimization uses prior knowledge of the product (the die layout) when optimizing the process parameter. A least squares optimization typically treats each location equally, without taking into account the die layout. As such, a least squares optimization may prefer a correction which "only" has four locations out-of-specification, but each in a different die, over a correction which has seven locations out-of-specification, but only affecting two dies (e.g., four defects in one die, three in another). However, as a single defect will tend to render a die defective, maximizing the number of defect-free dies (i.e., dies-in-spec) is ultimately more important than simply minimizing the number of defects per substrate. It should be appreciated that dies-in-spec optimization may comprise a maximum absolute (max abs) per die optimization. Such a max abs optimization may minimize the maximum deviation of the performance parameter from a control target. A differentiable approximation for the max abs function could be used instead, so that the cost function is easier to solve. For this to be effective, detail such as the wafer map should be used in the optimization.

In an embodiment, the dies-in-spec optimization may be further improved by using a "dead dies" database. Such a database is maintained dynamically and records all instances where a die is believed to have, or is estimated will have at least one defect (e.g., using previous yield data, data form other lithographic process and/or a defocus estimation map), such that it is considered to be dead (defective). Such dead dies may then be further sacrificed in the optimization. This may be achieved by attributing a very large or limitless process window to the dead die, beyond that of the actual limits for it to be functional. By increasing the likelihood of more defects in the dead die, more flexibility may be provided for optimization or control for the other dies. This may therefore lower the likelihood of a defect in another die in an optimization for that same layer, or for successive layers, thereby further maximizing the number of dies-in-spec.

Another (secondary) statistical indicator might be a balance in the optimization which balances consideration of partial dies with respect to full dies on the substrate. Partial dies, of course, can never yield as they are incomplete. Intuitively, therefore, it might be thought that they can be ignored. However, this can have a negative effect on the full dies, as allowing parameters to veer a long way of spec can affect a neighboring (full) die. At the same time, it makes sense to give partial dies less consideration as full dies. A similar (or the same) balancing may be done for dies in the dead die database (where appropriate); for example dead dies may be given the same (or other appropriate) weighting as partial dies (with respect to live full dies) rather than being ignored completely.

In addition to maximizing the number of in-spec dies, the dies-in-spec optimization may be further improved, in an embodiment, by performing process window optimization which maximizes the process window margin (the degree to which the focus or other process parameter is within-spec), per substrate or layer. This may comprise using a parameter value (e.g., defocus) estimation map and product layout information (e.g., BF and DoF maps). The defocus estimation map may be obtained via computational metrology (e.g., lithographic process modeling). Computational metrology process window optimization may use these maps to maximize the margin of the modeled parameter value (e.g., focus) with respect to the corresponding process window (e.g., depth of focus) and/or minimize the difference between the modeled parameter value with respect to the corresponding best parameter value (e.g., best focus). As such, this method may comprise a maximization over an optimization space, of the minimum distance between a) a local excursion of said performance parameter with respect to a corresponding best parameter value (or other control target value) and b) a local edge of the corresponding allowed variation space.

By way of a specific example, the focus and overlay merit function terms in the merit function example may be amended to include one or more process window tracking terms (more specifically, one or more of best focus BF, best dose BE and wavefront target WT terms) as a correction to the measurement terms; e.g.:

$$M = a_1(MA_x - a_{01}[MA_z - BF_0]) + a_3 MSD_x +$$
$$a_4 MSD_x^2 + b_1(MA_y - b_{01}[MA_z - BF_0]) + b_3 MSD_y +$$

-continued
$$b_4 MSD_y^2 + c_2(MA_z - [BF_0 + c_{03}(D - BE_0)])^2 + c_3 MSD_z +$$
$$c_4 MSD_z^2 + d_1(D - BE_0) + \Sigma_i e_{1i}(Z_i - WT_i) + e_{2i}(Z_i - WT_i)^2$$

A dies-in-spec optimization may comprise an iterative process whereby residuals of a first estimate (possibly comprising a least-squares fit) are calculated, and based on this the likelihood of a defect resulting from each residual. A maximum defect likelihood per die is calculated and the number of dies likely to have defects is determined. Then, over a number of iterations recommencing with the calculation of residuals, the relevant parameters are varied to minimize the number of dies likely to have defects.

A full dies-in-spec optimization may be computationally demanding and take a long time to implement. To speed up this process, an embodiment may comprise a max-abs-per row (e.g., slit) approximation, instead of a full dynamic max abs optimization. The effects in x-direction tend to dominate, and the slit length is short. Therefore it is proposed to perform a series of max-abs optimizations in the slit direction only, to obtain a series of (static) max abs optimizations during the scan, which can then be smoothed over; e.g., low pass (slit or lens set point speed) filtered over the resultant static set-points.

In an embodiment, the optimization may be a higher order optimization, for example to optimize $EPE^4$ so as to better stress weak points A pattern placement error PPE term may be included to stabilize overlay, e.g., to balance EPE against overlay.

The optimization may be a per layer lumped merit function aggregated for all structures on the layer (e.g., all clips and cutlines), and throughout the full process window (e.g., through focus, dose, aberrations and reticle writing errors RWE). As such the merit function may take the form of $$M = \sum_{\substack{clips \\ cutlines}} \sum_{\substack{focus \\ dose \\ RWE \\ aberrations}} EPE_i^4 + cPPE_i^4$$

where $EPE_i$ may described by any of the merit functions described or explicitly recited herein.

Figure 6:
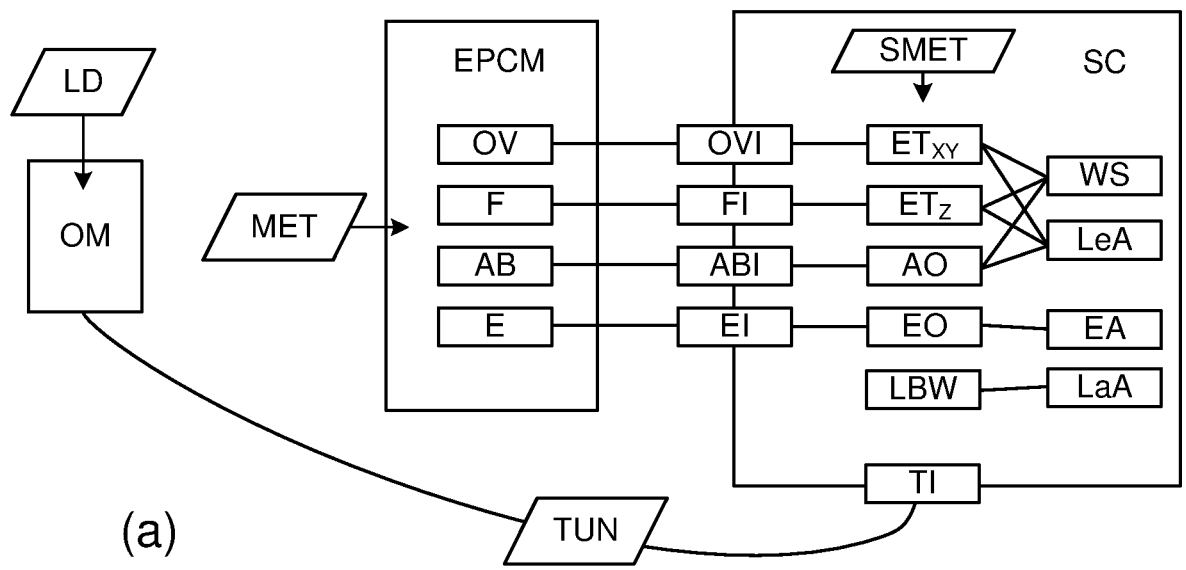
FIG. 6 schematically illustrates (a) an arrangement and (b) a method of controlling of a lithographic apparatus according to embodiments of the invention.
Figure 6:
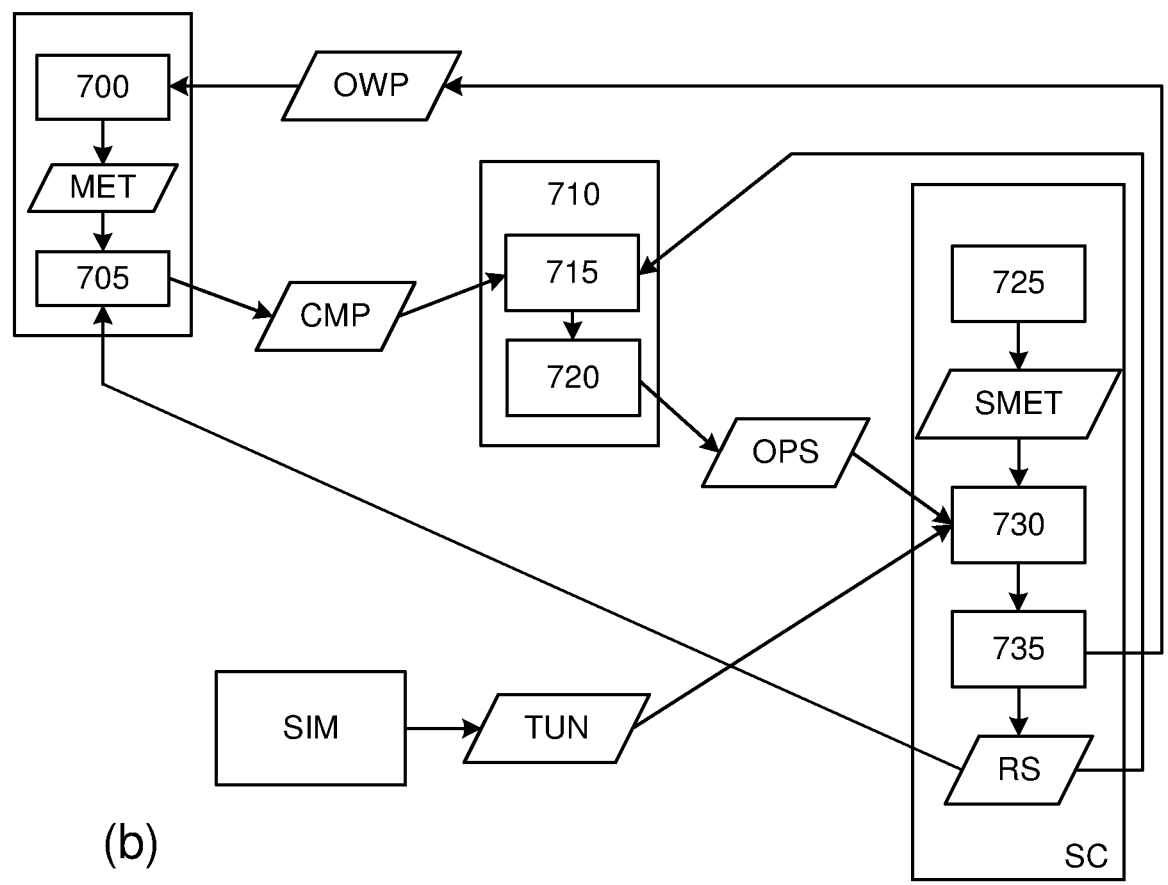

FIG. 6 illustrates a practical, inline, implementation of the above concepts. FIG. 6(a) shows the basic arrangement in terms of modules and FIG. 6(b) is a flow diagram describing an exemplary process control method. In an inline implementation, the optimization is based predominately on inline metrology, such as scanner metrology (pre-exposure metrology). Such scanner metrology may comprise alignment and/or levelling metrology for example. Such inline metrology is performed per substrate and the optimization may therefore be substrate specific.

In FIG. 6(a) an edge placement control module EPCM receives metrology data MET (comprising any suitable metrology data, including scatterometry data (e.g., DBO, DBF data), CD-SEM data etc. The edge placement control module generates optimization data comprising optimization sub-recipes OMS for weighting the merit function within the scanner. The optimization data OMS may comprise, for example, one or more of: die layout information, dead die data (e.g., a dead die map as will be described in more detail below), best setting data comprising estimated or known best settings for the performance parameter (e.g., in the form of a best setting map), criticality data (e.g., an allowed process parameter variation space such as a process window which may or may not be associated with the best setting map), a modelled (estimated) value for the performance parameter (e.g., an estimation map), or a desired Moving Average (MA) to time Moving Standard Deviation (MSD) balance ratio (MA:MSD) which will be described below. It should be noted that this list is non-exhaustive.

The metrology data may comprise after-develop inspection (ADI) data and/or after-etch inspection (AEI) data. The metrology data MET may comprise overlay data OV, focus data F, aberration data AB and dose data E. In each case, where appropriate, this metrology data may have had "scanner content" removed, e.g., it has been decorrected to remove s metrology component has already been corrected (such as a levelling component, alignment component etc.) This ensures that these corrections are not implemented twice. This decorrected metrology and/or estimates based thereon (e.g., best estimate describing parameter values on the substrate are fed forward (e.g., via corresponding control (offset) interfaces OVI, FI, ABI, EI) to the scanner SC. The scanner comprises a plurality of optimizers (e.g., optimizing within a different control regime), more specifically overlay exposure trajectory optimizer $ET_{XY}$, levelling exposure trajectory optimizer $ET_Z$, aberration optimizer AO, dose optimizer EO and laser bandwidth optimizer LBW. Each (or at least some) of these optimizers implements the same merit function, and optimizes control for one or more actuators based on inline (scanner) metrology SMET (first metrology data). The actuators shown in this example comprise the wafer stage actuator WS, lens actuators LeA, dose actuator EA, and laser actuator LaA.

FIG. 6(a) also shows a per-layer (set-up) optimization module OM which receives layer design information LD and outputs to the scanner (e.g., via tuning interface TI), tuning data TUN comprising specific feature and/or layer sensitivities, best focus/dose values, wavefront targets etc. to tune the merit function in each optimization.

FIG. 6(b) shows the arrangement in terms of a process flow. Metrology is performed 700 to determine metrology data MET. The metrology data may be (optionally) computationally enhanced 705 using scanner residual data, to determine high definition computational metrology maps CMP. An edge placement control step 710 may comprise a decorrection step 715, to remove one or more correction components which have already been corrected for, and an estimation step 720, which provides a best estimate of what is actually on the wafer (e.g., values across the wafer). The output of the estimation step 720 is optimization data comprising optimization sub-recipes OPS (e.g., metrology offset fingerprints). These optimization sub-recipes OPS, along with scanner metrology SMET (obtained from a scanner metrology action 725) are used in an optimization step 730 (e.g., EPE optimization using a merit function described herein) in the scanner SC. The merit function used in the optimization step may be tuned based on tuning data TUN describing specific feature and/or layer sensitivities, obtained from performance of a lithography simulation step SIM.

Based on the results of the optimization step 730, one or more actuation steps 735 are performed to actuate the calculated correction as best as possible. Based on the actuation, scanner residuals RS are calculated, which are used as an input to improve the metrology 700 and/or computational metrology 705 results, and as an input for the decorrection step 715 (e.g., for subtraction from the metrology maps CMP). On wafer performance data OWP (based on the actuation step 735) is fed back to the metrology step 700.

In an embodiment, the scanner metrology data SMET may modeled and/or filtered metrology data. In an embodiment, the scanner metrology data may comprise a continuous substrate map or continuous wafer map (CWM). The continuous wafer map may comprise a model which corrects for one or more of: sensor noise, sensor calibration drift, sensor data filtering artefacts, sparse sampling limitations and/or finite sensor spot size in a sampled substrate map which maps the process parameter variation across the substrate. A CWM, in some systems, is presently maintained offline. The CWM can be maintained within the scanner and updated in real time (e.g., updated per substrate).

There are many specific control strategies, and in particular co-optimized control strategies, which can be illustrated by the arrangement and process described by FIG. 6. For example, in a co-optimized focus and dose control strategy, the metrology data MET may comprise focus data and dose related data based on measurement of diffraction based focus targets and CD metrology. This may be converted 705 into high density focus and CD maps CMP. Following the decorrection step 715 and estimation step 720, the optimization step 730 uses the sub-recipes OPS in an EPE optimization 730, based on the scanner metrology data SMET. The scanner metrology data SMET may comprise levelling data, dose sensor data and lens aberration data, for example. The EPE optimization 730 is a co-optimization for focus and dose (and possibly lens aberration and/or any other parameter) combined; i.e., focus may be controlled effectively through dose control, when direct focus control is not possible.

Additionally, in another embodiment, the scanner may use one or more optimization recipes, levelling data (wafer map) and alignment data to co-optimize focus, dose and overlay to optimize the EPE. Other scanner parameters could be included in the co-optimization, such as Zernike aberration control/lithometric control, Jones pupil beyond aberration, laser bandwidth, contrast MSDxyz from stage and lens element movements. The co-optimization may also comprise any combination of two or more of these parameters. As such, specific, exemplary co-optimization strategies may comprise overlay wafer stage MA/MSD optimization, an overlay/focus (non-telecentricity) optimization, a focus/dose/$MSD_z$ optimization, an overlay/focus/dose/$MSD_{xyz}$ optimization, or an overlay/focus/dose/$MSD_{xyz}$/laser bandwidth/wavelength optimization. In any of these cases, a lens optimization may also be performed, for example as a lithometric sub-recipe (but still as part of a single optimization).

In many cases, when co-optimizing for a single feature, a single lumped (e.g., averaged) sensitivity is sufficient. However, in some cases (e.g., focus/dose co-optimization), better results may be obtained using a sensitivity distribution from multiple features, e.g., to balance the sensitivities. Using the specific example of focus/dose co-optimization, and considering a plot of focus sensitivity against dose sensitivity, the angle of any line from the origin represents a different ratio of the two sensitivities. In principle, the collection of sensitivities to be balanced should include the furthest point for each angle. An approximating algorithm may be based on a (continuous or sampled) convex envelope of sensitivities defined by linking of the points representing the furthest process window limiting features, such that the envelope envelopes at least all of the process window limiting features. The balancing could then be based on a combined (e.g., summed) merit function for each of these features.

In another embodiment focus and overlay are co-optimized. Due to various factors the substrate may be exposed in a non-telecentric fashion; e.g. the center of gravity of the light distribution in a pupil plane of the optics of the lithographic apparatus is not perfectly centered. This causes a focus dependent pattern shift of the (product) features that need to be provided to the substrate. For example a non-telecentricity of 10 mrad will give a pattern shift of 0.1 nm per 10 nm focus offset. In case one would like to correct a known overlay error of 0.2 nm on a system having a telecentricity error of 15 mrad the overlay error could at least partially be corrected by altering the (best) focus setting such that a part of the overlay error is compensated for. In this case a 14 nm focus offset would be sufficient to compensate the observed or anticipated 0.2 nm overlay error. However overlay errors are not the only drivers behind the performance of the lithographic process as such. A strong deviation of the focus from a best focus setting in view of imaging quality comes with a deterioration of the imaging contrast; both overlay improvement and image contrast deterioration need to be carefully balanced based on the expected feature specific overall EPE improvement. In an embodiment substrate height variation data, overlay data and telecentricity data are available. Co-optimized focus and overlay control is utilized to correct the overlay error and substrate height variations such that the expected EPE is optimized; e.g. focus is at least partially controlled such that the overlay error is partially compensated due to the interaction of the focus offset and the non-telecentricity of the lithographic apparatus.

As such, it is disclosed herein to use focus, dose, overlay or other scanner parameters, or combinations thereof to determine a product specific scanner optimization sub-recipe (offline) and use this to determine a performance based scanner optimization algorithm based on a common merit function for all control regimes, which allows input from the optimization sub-recipe and can be calculated per substrate or per layer based on substrate specific metrology.

In addition to the inline scanner control (feedforward) case already described and illustrated in FIG. 6, an offline (feedback) implementation is also possible. In such an offline implementation (referring to FIG. 6(b), the main difference is that the EPE co-optimization step 730 would be performed as part of the edge placement control step 710 (outside of scanner SC) based on (e.g., lot averaged) metrology data, so as to determine a sub-recipe in terms of actuator offsets, for the actuation step 735. The actuation step 735 would use these offsets in conjunction with more standard (separate) focus and dose optimization based on the scanner metrology SMET.

In an embodiment, the tuning optimization recipe (optimization data) may comprise some or all of the following (non-exhaustive):

a best parameter value or setpoint map per field (or die). This may comprise, for example, a best focus map (where the process parameter(s) include focus) and/or a best energy map (where the process parameter(s) include dose).

An allowed variation space for the process parameter (e.g., allowed variation range or process window) per point in field (or die). This may comprise a depth of focus map and/or an exposure latitude map for example.

A set of optimization balancing definitions/weights which may include, for example: litho metric equations for lens aberration impact balancing such as described in WO2009/148976 (hereby incorporated herein by reference), levelling MA:MSD ratio (z direction), overlay vs imaging MA:MSDxy, and/or partial:full die weight.

Additionally, the optimization data may comprise reference data. The reference data may comprise, more specifically, estimated/modeled data such as an estimation map from metrology data, e.g., an estimated focus map or estimated effective dose map (CD divided by dose sensitivity). The optimization data may also comprise per-layer data (e.g., die layout data and/or dead die data).

An advantage of this methodology is that the product specific information is not inputted directly to the scanner, but only to the offline processing device which uses this to determine an optimization sub-recipe. This optimization sub-recipe is fairly neutral with regard to the sensitive product specific information which is essentially hidden from the scanner. This will be beneficial for parties who may wish to ensure such information product specific information remains confidential.

Further embodiments of the invention are disclosed in the list of numbered clauses below:

1. A method for controlling a lithographic apparatus configured to provide product structures to a substrate in a lithographic process, the method comprising:
   obtaining first metrology data related to the substrate; and
   optimizing control of the lithographic apparatus in at least two different control regimes during the lithographic process based on said metrology data by optimizing a common merit function for each control regime.
2. A method according to clause 1, wherein said first metrology data comprises substrate specific metrology data as measured and/or modeled before the providing of product structures to the substrate, said substrate specific metrology data comprising metrology data relating to a characteristic of the substrate to which the structures are being applied and/or the state of the lithographic apparatus at the time that the structures are applied to the substrate.
3. A method according to clause 2, wherein said substrate specific metrology data describes one or more of: a characteristic of the substrate or a reticle used to apply the product structures to the substrate; a characteristic of a patterning device which defines a device pattern which is to be applied to the substrate; a position of one or both of a substrate stage for holding the substrate and a reticle stage for holding a patterning device; or a characteristic of a radiation system which provides a radiation beam for transferring a pattern on said patterning device to the substrate.
4. A method according to clause 2 or 3, wherein said optimizing control step is performed separately for each substrate on which said product structures are provided based on substrate specific metrology data corresponding to that substrate.
5. A method according to any of clauses 2 to 4, wherein said optimizing step is performed within the lithographic apparatus for at least a subset of the two or more control regimes.
6. A method according to any of clauses 2 to 5, wherein said first metrology data comprises leveling data describing the substrate shape and said one or more control regimes comprises control of one or both of a substrate stage and a reticle stage comprised within the lithographic apparatus parallel to a substrate plane and control of one or both of the substrate stage and reticle stage perpendicular to the substrate plane.
7. A method according to clause 1 wherein said first metrology data comprises averaged metrology data, averaged over a plurality of substrates, and said optimization step is performed based on said averaged metrology data so as to determine a sub-recipe in terms of actuator offsets, said sub-recipe being forward to the lithographic apparatus for use in one or more further optimizations.

8. A method according to any preceding clause, wherein the control regimes comprise two or more of: exposure trajectory control in each of the x, y and z directions, lens aberration correction, dose control and laser bandwidth control for a source laser of the lithographic apparatus.

9. A method according to any preceding clause, the merit function is operable to minimize edge placement error.

10. A method according to clause 9, wherein the merit function is operable to minimize edge placement error to at least the power 4.

11. A method according to any preceding clause, wherein the merit function further comprises a pattern placement error PPE term to balance the solution against overlay.

12. A method according to any preceding clause, wherein the merit function comprises terms relating to at least two of: overlay control, focus control and dose control.

13. A method according to any preceding clause, wherein the merit function comprises terms relating to at least two of overlay control, focus control, dose control, aberration control, contrast control and source laser output control.

14. A method according to any preceding clause, wherein the merit function comprises terms relating to at least four of overlay control, focus control, dose control, aberration control, contrast control and source laser output control.

15. A method according to clause 12, 13 or 14, wherein said terms comprise at least some of: $MSD_X$, $MSD_Y$, $MSD_Z$, $MA_X$, $MA_Y$ $MA_Z$, $MSD^2_X$, $MSD^2_Y$ $MSD^2_Z$, on or more Zernike aberration terms $Z_i$, a laser bandwidth term and a laser wavelength term.

16. A method according to any preceding clause, wherein said optimization step comprises, for each control regime, applying a zero weighting to any term of said merit function not relevant to that control regime.

17. A method according to any preceding clause, merit function comprises a per layer lumped merit function aggregated for all structures on the layer and throughout the full process window.

18. A method according to any preceding clause, wherein said merit function is configured according to optimization data comprising measured and/or simulated data of at least one performance parameter associated with the product structures and/or their arrangement which are to be applied to the substrate in the lithographic process.

19. A method according to clause 18, comprising the step of decorrecting said optimization data to remove a component which has already been corrected.

20. A method according to clause 18 or 19, wherein said optimization data comprises dead die data indicative of which dies are deemed not functional because there is estimated to be at least one defect in at least one layer of said die.

21. A method according to any of clauses 18 to 20, wherein said optimization data comprises best parameter value data relating to one or more of said at least one performance parameter, said control target value being derived from, or defined by, the best parameter value data.

22. A method according to clause 21, wherein said best parameter value data comprises a best focus map describing the best focus settings across a field and/or across a die.

23. A method according to clause 22, wherein said best focus map comprises micro topology data describing expected height variation within a die according to associated product layout data.

24. A method according to clause 21, 22 or 23, wherein said best parameter value data comprises a best energy map describing the best energy settings across a field and/or across a die.

25. A method according to any of clauses 18 to 24, wherein said optimization data comprises criticality data for one or more of said at least one performance parameter, said criticality data defining an allowed variation space across a field and/or across a die for the performance parameter, and said optimization comprises maximizing over an optimization space, the minimum distance between a) a local excursion of said performance parameter with respect to the corresponding control target value and b) a local edge of a corresponding allowed variation space.

26. A method according to any of clauses 18 to 25, wherein the optimization data comprises a preferred ratio of:
    a Moving Average error, and
    a time Moving Standard Deviation of the error;
    of the substrate stage and/or reticle stage and/or lens aberration impact.

27. A method according to any of clauses 18 to 26, wherein said optimization data comprises estimated data for said performance parameter.

28. A method according to any of clauses 18 to 27, wherein said optimization data comprises measured data relating to measurement of the at least one performance parameter from product structures which have been previously provided to a substrate.

29. A method according to any preceding clause, wherein said optimization step comprises minimizing the maximum deviation of the performance parameter from a corresponding control target value and/or maximizing the distance of the performance parameter from edges of a corresponding allowed variation space for the performance parameter.

30. A method according to clause 29, wherein said optimization step comprises maximizing the number of dies provided on the substrate which are estimated to be within a specification indicative that the die will be functional.

31 A method according to clause 30, wherein said optimization step comprises maximizing the number of dies which comprise no defects.

32. A method according to clause 30 or 31, wherein said optimization step comprises a series of max-abs optimizations in the direction only of an exposure slit of the lithographic apparatus, to obtain a series of max abs optimizations during a scan, and low pass filtering over the results of these series of optimizations.

33. A method according to any preceding clause, wherein said optimizing step comprises using said optimization data to determine weighting of parameters comprised within the merit function.

34. A method according to any preceding clause, wherein said first metrology data comprises substrate height variation data.

35. A method according to any preceding clause, wherein said first metrology data comprises modeled and/or filtered metrology data.

36. A method according to any preceding clause, wherein said first metrology data comprises a continuous substrate map, the continuous substrate map comprising a model which corrects for one or more of: sensor noise, sensor calibration drift, sensor data filtering artefacts, sparse sampling limitations and/or finite sensor spot size in a sampled substrate map which maps the process parameter variation across the substrate.

37. A method according to any preceding clause, wherein said first metrology data comprises patterning device height variation data.

38. A method according to any preceding clause, wherein said first metrology data comprises offline substrate metrology data.

39. A method according to clause 38, wherein said offline first metrology data comprises one or more of micro topology data, Level Sensor process dependency data, layer thickness profile data, global substrate shape and substrate bending data.

40. A method according to any preceding clause, wherein said first metrology data comprises alignment data relating to a position of one or both of the substrate stage and reticle stage.

41. A method according to any preceding clause, comprising controlling the lithographic process according to said optimized control.

42. A method according to any preceding clause, wherein the lithographic process comprises exposure of a single layer on a substrate, forming part of a manufacturing process for manufacturing an integrated circuit.

43. A computer program comprising program instructions operable to perform the method of any of clauses 1 to 42, when run on a suitable apparatus.

44. A non-transient computer program carrier comprising the computer program of clause 43.

45. A processing device comprising storage means, said storage means comprising the computer program of clause 43; and a processor operable to perform the method of any of clauses 1 to 42 responsive to said computer program.

46. A lithographic apparatus configured to provide product structures to a substrate in a lithographic process, comprising the processing device of clause 44.

47. A lithographic apparatus according to clause 46, further comprising:
   a substrate stage for holding the substrate;
   a reticle stage for holding a patterning device;
   a projection lens for projecting a pattern on said patterning device onto said substrate; and
   a metrology system operable to measure first metrology data before the providing of product structures to the substrate.

48. A lithographic apparatus according to clause 47 comprising a plurality of actuators, said plurality of actuators comprising one or more actuators for each of said substrate stage, reticle stage and projection lens, wherein said actuators are controlled based on an optimization performed according to said computer program.

49. A lithographic apparatus according to clause 48 further comprising a laser source module for providing exposure radiation, and said plurality of actuators comprises an actuator for varying the laser source module output.

50. A method for controlling a lithographic apparatus configured to provide product structures to a substrate in a lithographic process, the method comprising:
   obtaining first metrology data related to the substrate; and
   optimizing control of the lithographic apparatus in at least two different control regimes during the lithographic process based on said metrology data by optimizing a common merit function for each control regime, wherein the first metrology data comprises at least substrate height variation data, overlay data and telecentricity data associated with the lithographic apparatus and wherein the control regimes are overlay control and focus control of the lithographic apparatus.

Within this disclosure, any mention of a process window may comprise an overlapping process window as described and/or an N-dimensional dimensional process window (e.g., the axes may comprise one or more of focus, dose, overlay, contrast, etc.). In an embodiment, process window tracking may be employed. This comprises limiting locally one (or more) of the process window axes, thereby shifting the set-point of another axis or axes. In all cases the process window (or more generally the criticality metric) may be determined from product information or reticle design information (relating to the structures being exposed) and/or simulated design information to determine the process window information.

The terms "radiation" and "beam" used in relation to the lithographic apparatus encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method for configuring an apparatus for providing structures to a layer on a substrate, the method comprising:
   obtaining first data comprising substrate specific data as measured and/or modeled before the providing of the structures to the layer on the substrate; and
   determining, by a hardware computer system, a configuration of the apparatus for at least two different control regimes based on the first data and the use of a common merit function comprising parameters associated with the at least two control regimes; and
   providing the configuration to the apparatus for control of the providing structures to a layer on a substrate.

2. The method according to claim 1, wherein the substrate specific data comprises metrology data relating to a characteristic of the substrate and/or state of the apparatus at the time that the structures are provided to the layer on the substrate.

3. The method according to claim 1, wherein the determining a configuration is performed separately for each substrate on which the structures are provided based on the substrate specific data corresponding to that substrate.

4. The method according to claim 1, wherein the apparatus is a lithographic apparatus and the substrate specific data comprises leveling data describing a shape of the substrate and one or more of the control regimes comprises control of one or both of a substrate stage and a reticle stage comprised within the lithographic apparatus parallel to a substrate plane and control of one or both of the substrate stage and reticle stage perpendicular to the substrate plane.

5. The method according to claim 1, wherein the first data comprises averaged metrology data, averaged over a plurality of substrates, and the determining a configuration is performed based on the averaged metrology data so as to determine one or more actuator offsets for the apparatus for use in one or more further steps of determining of a configuration.

6. The method according to claim 1, wherein the apparatus is a lithographic apparatus and the control regimes comprise two or more selected from: exposure trajectory control in each of the x, y and z directions, lens aberration correction, dose control, and/or laser bandwidth control for a source laser of the lithographic apparatus.

7. The method according to claim 1, wherein the apparatus is a lithographic apparatus and the common merit function is operable to minimize edge placement error.

8. The method according to claim 1, wherein the common merit function comprises parameters relating to at least two selected from: overlay control, focus control, dose control, aberration control, contrast control and/or source laser output control.

9. The method according to claim 1, wherein the common merit function is configured according to optimization data comprising measured and/or simulated performance parameter data associated with the structures and/or their arrangement which are to be applied to the layer on the substrate.

10. The method according to claim 9, wherein the optimization data comprises best performance parameter data.

11. The method according to claim 10, wherein the best performance parameter data comprises i) a best focus map describing best focus settings across a field and/or across a die of the layer on the substrate and/or ii) a best energy map describing best energy settings across a field and/or across a die of the layer on the substrate.

12. The method according to claim 9, wherein the determining a configuration comprises minimizing a maximum deviation of the performance parameter from a corresponding control target value and/or maximizing a distance of the performance parameter from edges of a corresponding allowed variation space of the performance parameter.

13. The method according to claim 9, wherein the determining a configuration comprises using the optimization data to determine weighting of the parameters comprised within the common merit function.

14. The method according to claim 1, wherein the determining a configuration comprises maximizing a number of dies provided to the layer on the substrate which are estimated to be within a specification indicative that the die will be functional.

15. A computer program product for configuring an apparatus for providing structures to a layer on a substrate, the computer program product comprising a non-transitory computer-readable medium comprising program instructions therein, the instructions, when executed by a computer system, configured to cause the computer system to at least:
   obtain first data comprising substrate specific data as measured and/or modeled before the providing of structures to a layer on a substrate; and
   determine a configuration of an apparatus for providing the structures for at least two different control regimes based on the first data and the use of a common merit function comprising parameters associated with the at least two control regimes; and
   provide the configuration toward the apparatus for control of the providing structures to a layer on a substrate.

16. The computer program product according to claim 15, wherein the substrate specific data comprises metrology data relating to a characteristic of the substrate and/or state of the apparatus at the time that the structures are provided to the layer on the substrate.

17. The computer program product according to claim 15, wherein the instructions configured to cause the computer system to determine a configuration are configured to cause the computer system to determine a configuration separately for each substrate on which the structures are provided based on the substrate specific data corresponding to that substrate.

18. The computer program product according to claim 15, wherein the apparatus is a lithographic apparatus and the substrate specific data comprises leveling data describing a shape of the substrate and the one or more of the control regimes comprises control of one or both of a substrate stage and a reticle stage comprised within the lithographic apparatus parallel to a substrate plane and control of one or both of the substrate stage and reticle stage perpendicular to the substrate plane.

19. The computer program product according to claim 15, wherein the first data comprises averaged metrology data, averaged over a plurality of substrates, and the instructions configured to cause the computer system to determine a configuration are further configured to cause the computer system to determine a configuration using the averaged metrology data so as to determine one or more actuator offsets for the apparatus for use in one or more further steps of determining a configuration.

20. The computer program product according to claim 15, wherein the apparatus is a lithographic apparatus and the control regimes comprise two or more selected from: exposure trajectory control in each of the x, y and z directions, lens aberration correction, dose control, and/or laser bandwidth control for a source laser of the lithographic apparatus.

* * * * *